(12) United States Patent
Chiang

(10) Patent No.: US 8,284,890 B2
(45) Date of Patent: Oct. 9, 2012

(54) SHIFT REGISTER WITH TWO-WAY TRANSMISSION AND LIQUID CRYSTAL DISPLAY DEVICE USING SAME

(75) Inventor: Chien-Hsueh Chiang, Miao-Li County (TW)

(73) Assignee: Chimei Innolux Corporation, Miao-Li County (TW)

( * ) Notice: Subject to any disclaimer, the term of this patent is extended or adjusted under 35 U.S.C. 154(b) by 36 days.

(21) Appl. No.: 12/955,915

(22) Filed: Nov. 30, 2010

(65) Prior Publication Data

US 2011/0129052 A1    Jun. 2, 2011

(30) Foreign Application Priority Data

Dec. 1, 2009    (CN) .......................... 2009 1 0310739

(51) Int. Cl.
*G11C 19/00* (2006.01)
(52) U.S. Cl. ................ 377/64; 377/69; 377/78; 377/79
(58) Field of Classification Search .................. None
See application file for complete search history.

(56) References Cited

U.S. PATENT DOCUMENTS

| | | | | |
|---|---|---|---|---|
| 8,018,423 B2* | 9/2011 | Tsai et al. | ..................... | 345/100 |
| 8,045,675 B2* | 10/2011 | Chan et al. | ..................... | 377/64 |
| 2010/0150301 A1* | 6/2010 | Chan et al. | ..................... | 377/64 |
| 2010/0150303 A1* | 6/2010 | Tsai et al. | ..................... | 377/79 |
| 2010/0245300 A1* | 9/2010 | Chan et al. | ..................... | 345/204 |
| 2010/0260312 A1* | 10/2010 | Tsai et al. | ..................... | 377/79 |
| 2011/0044423 A1* | 2/2011 | Lin et al. | ..................... | 377/64 |
| 2011/0274234 A1* | 11/2011 | Sakamoto et al. | ............... | 377/64 |

FOREIGN PATENT DOCUMENTS

CN    101145399 A    3/2008

\* cited by examiner

*Primary Examiner* — Tuan T Lam
(74) *Attorney, Agent, or Firm* — WPAT PC; Justin King

(57) ABSTRACT

A shift register includes individually connected shift register units. Each shift register unit includes a switching unit, a pre-charging unit, a pulse signal output unit, a low level voltage signal control unit, a first clock pulse signal input, a second clock pulse signal input, and an output. The first and the second clock pulse signal inputs respectively receive a first clock signal and a second clock signal, the first clock signal and the second clock signal having reverse clock pulses during each clock cycle. The switching unit receives at least one external starting signal and a high level signal, when the at least one external starting signal is high level, the switching unit is turned on and outputs the high level signal to the pre-charging unit. When the second clock signal is high level, the pre-charging unit receives the high level signal and charges, and when the first clock signal is high level, the pre-charging unit discharges. The pulse signal output unit receives the first clock signal and outputs the first clock signal to the output after the pre-charging unit charges and before the pre-charging unit finishes discharging. The low level voltage signal control unit receives the first clock signal and the second clock signal, after the pre-charging unit finishes discharging, the low level voltage signal control unit pulls down a voltage level on the output at low level when the second clock signal are high level.

23 Claims, 7 Drawing Sheets

US 8,284,890 B2

SHIFT REGISTER WITH TWO-WAY TRANSMISSION AND LIQUID CRYSTAL DISPLAY DEVICE USING SAME

BACKGROUND

1. Technical Field

The present disclosure generally relates to shift registers, and particularly to a shift register employed by a gate driving circuit of a liquid crystal display (LCD) device.

2. Description of Related Art

Commonly used LCD devices have the advantages of portability, low power consumption, and low radiation, and are widely used in various electronic devices such as notebooks, personal digital assistants (PDAs), video cameras, televisions, and others. Especially, thin film transistor (TFT) LCD devices have become popular output devices for many digital devices.

Often, an LCD device includes a display panel and a driving circuit driving the display panel to display images. The driving circuit includes a data driving circuit and a gate driving circuit. The data driving circuit provides image data to the display panel, and the gate driving circuit turns TFTs of the display panel on or off. The gate driving circuit has a shift register as a core element thereof. The shift register successively provides pulse signals to each gate line of the display panel according to a preset way, and successively turns on the TFTs connected to each gate line. However, the gate driving circuit using the shift register can merely transmit signals along a fixed route, for example, from a first gate line to a last gate line or from the last gate line to the first gate line. As a result, the gate driving circuit can not be used in a variety of different display panels.

What is needed, therefore, is a shift register, and LCD device employing the shift register which can overcome the described limitations.

SUMMARY

A shift register includes a plurality of individually connected shift register units. Each shift register unit includes a switching unit, a pre-charging unit, a pulse signal output unit, a low level voltage signal control unit, a first clock pulse signal input, a second clock pulse signal input, and an output. The first and the second clock pulse signal inputs respectively receive a first clock signal and a second clock signal, the first clock signal and the second clock signal having reverse clock pulses during each clock cycle; the switching unit receives at least one external starting signal and a high level signal, when the at least one external starting signal is high level, the switching unit is turned on and outputs the high level signal to the pre-charging unit; when the second clock signal is high level, the pre-charging unit receives the high level signal output by the switching unit and charges, when the first clock signal is high level, the pre-charging unit discharges; the pulse signal output unit receives the first clock signal via the first clock pulse signal input, and outputs the first clock signal to the output after the pre-charging unit charges and before the pre-charging unit finishes discharging; and the low level voltage signal control unit receives the first clock signal and the second clock signal, after the pre-charging unit finishes discharging, the low level voltage signal control unit pulls down a voltage level on the output at low level when the second clock signal are high level.

Other novel features and advantages will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION

Reference will now be made to the drawings to describe the preferred and exemplary embodiments in detail.

Figure 1:
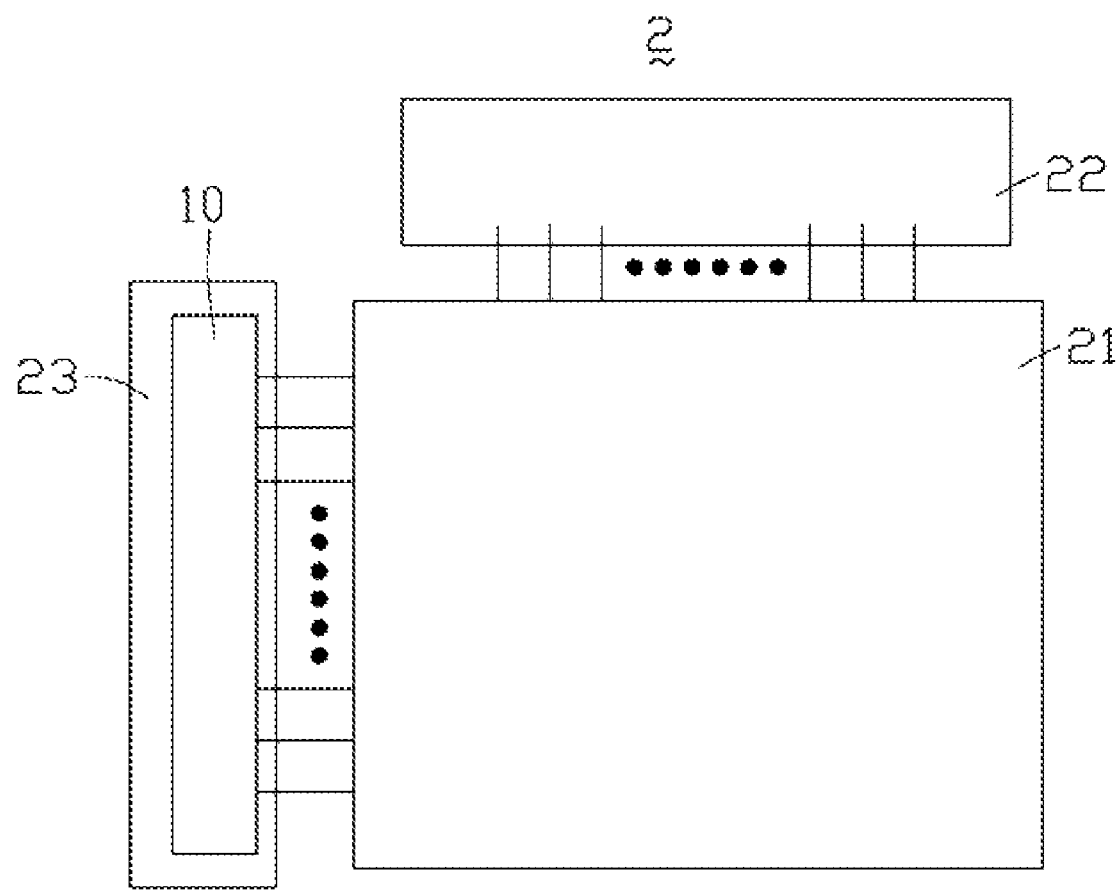
FIG. 1 is a schematic, partial block diagram of an LCD device according to an embodiment, the LCD device including a gate driving circuit, and the gate driving circuit including a shift register.

Referring to FIG. 1, a schematic, a partial block diagram of an LCD device according to an embodiment is shown. The LCD device 2 includes a display panel 21, a data driving circuit 22 connected to the display panel 21 via a plurality of data lines (not labeled), and a gate driving circuit 23 connected to the display panel 21 via a plurality of gate lines (not labeled). The display panel 21 includes a plurality of TFTs. The gate driving circuit 23 includes a shift register 10. The gate driving circuit 23 outputs gate signals to turn the TFTs on or off via the shift register 10. The data driving circuit 22 outputs data signals to the display panel 21 via the excited TFTs to display images.

Figure 2:
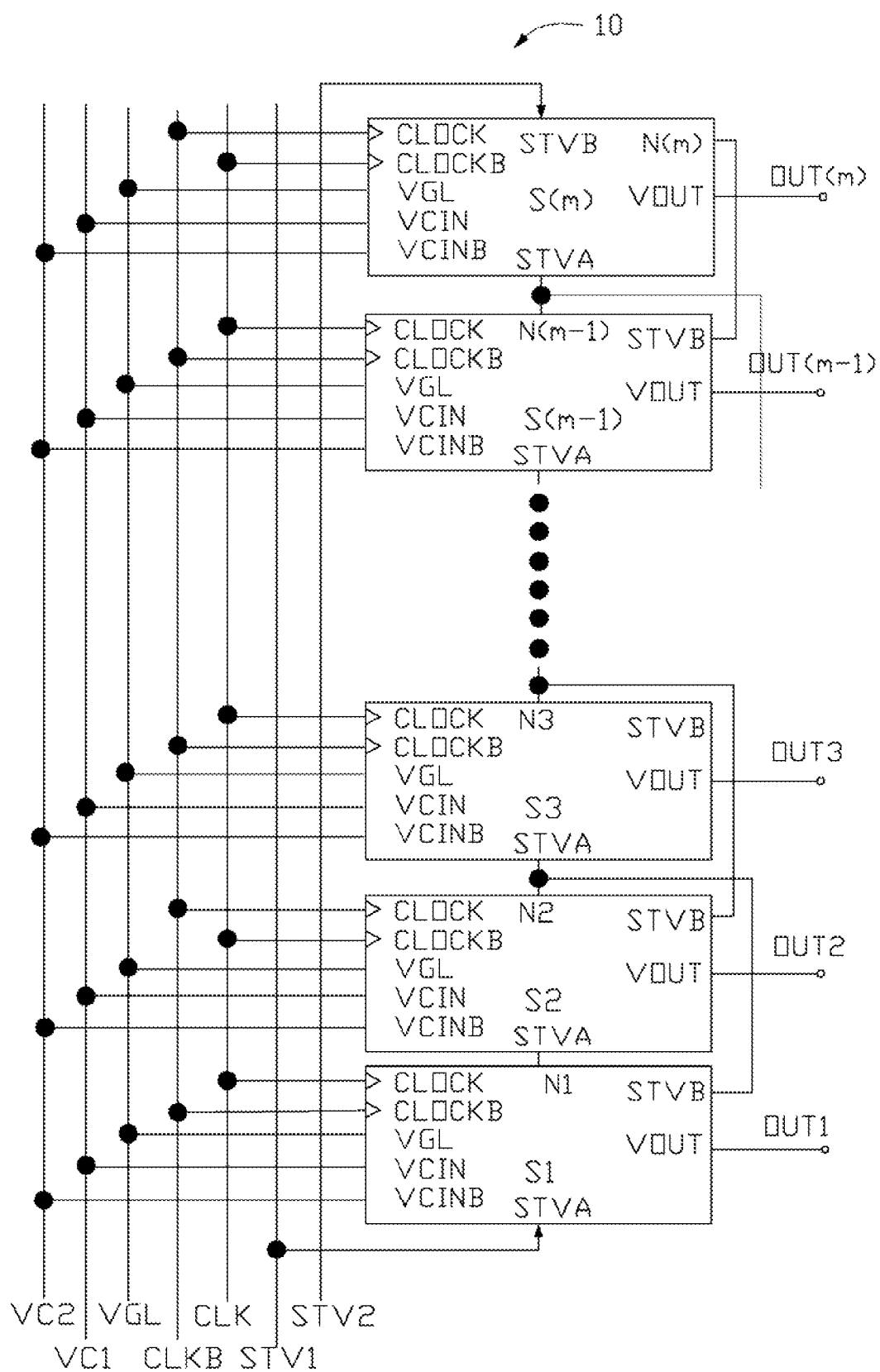
FIG. 2 is a schematic block circuit diagram of a shift register as disclosed, for a gate driving circuit, such as, for example, that of FIG. 1.

Referring to FIG. 2, a schematic block circuit diagram of the shift register 10 is shown. The shift register 10 includes a plurality of individually connected shift register units S1-S(m), wherein m is an integer and exceeds 1. Each shift register unit $S(i)(1 \leq i \leq m)$ includes a first input VCIN, a second input VCINB, a low level voltage signal input VGL, a first clock pulse signal input CLOCK, a second clock pulse signal input CLOCKB, a first starting signal input STVA, a second starting signal input STVB, a reference node N(i), and an output VOUT, wherein i exceeds or equals 1 and is less than or equals m. The output VOUT of each shift register unit S(i) is connected to a corresponding gate line.

Relating to the shift register unit S1, the first input VCIN of the shift register unit S1 is connected to an external circuit to receive a first signal VC1, and the second input VCINB of the shift register unit S1 is connected to the external circuit to receive a second signal VC2. The low level voltage signal input VGL of the shift register unit S1 is connected to the external circuit to receive a low level voltage signal VGL, such as 0 V voltage. The first clock pulse signal input CLOCK of the shift register unit S1 is connected to the external circuit to receive a clock pulse signal CLK, and the second clock pulse signal input CLOCKB of the shift register unit S1 is connected to the external circuit to receive a reverse clock pulse signal CLKB. The first starting signal input STVA of the shift register unit S1 is connected to the external circuit to receive a first starting pulse signal STV1, and the second starting signal input STVB of the shift register unit S1 is connected to a reference node N2 of the following shift register unit S2. The reference node N1 of the shift register unit S1 is connected to the first starting signal input STVA of the shift register unit S2. The output of the shift register unit S1 is connected to a corresponding gate line to output an output signal OUT1 to the gate line.

Relating to the shift register unit S(n), wherein n is even, exceeds 1 and is less than m, the first input VCIN of the shift register unit S(n) is connected to the external circuit to receive the first signal VC1, and the second input VCINB of the shift register unit S(n) is connected to the external circuit to receive the second signal VC2. The low level voltage signal input VGL of the shift register unit S(n) is connected to the external circuit to receive the low level voltage signal VGL. The first clock pulse signal input CLOCK of the shift register unit S(n) is connected to the external circuit to receive the reverse clock pulse signal CLKB, and the second clock pulse signal input CLOCKB of the shift register unit S(n) is connected to the external circuit to receive the clock pulse signal CLK. The first starting signal input STVA of the shift register unit S(n) is connected to the reference node N(n−1) of the previous shift register unit S(n−1), and the second starting signal input STVB of the shift register unit S(n) is connected to the reference node N(n+1) of the following shift register unit S(n+1). The reference node N(n) of the shift register unit S(n) is connected to the first starting signal input STVA of the shift register unit S(n+1) and the second starting signal input STVB of the shift register unit S(n−1). The output of the shift register unit S(n) is connected to a corresponding gate line to output an output signal OUT(n) to the gate line.

Relating to the shift register unit S(p), wherein p is odd, exceeds 1 and is less than m, the first input VCIN of the shift register unit S(p) is connected to the external circuit to receive the first signal VC1, and the second input VCINB of the shift register unit S(p) is connected to the external circuit to receive the second signal VC2. The low level voltage signal input VGL of the shift register unit S(p) is connected to the external circuit to receive the low level voltage signal VGL. The first clock pulse signal input CLOCK of the shift register unit S(p) is connected to the external circuit to receive the clock pulse signal CLK, and the second clock pulse signal input CLOCKB of the shift register unit S(p) is connected to the external circuit to receive the reverse clock pulse signal CLKB. The first starting signal input STVA of the shift register unit S(p) is connected to the reference node N(p−1) of the previous shift register unit S(p−1), and the second starting signal input STVB of the shift register unit S(p) is connected to the reference node N(p+1) of the following shift register unit S(p+1). The reference node N(p) of the shift register unit S(p) is connected to the first starting signal input STVA of the shift register unit S(p+1) and the second starting signal input STVB of the shift register unit S(p−1). The output of the shift register unit S(p) is connected to a corresponding gate line to output an output signal OUT(p) to the gate line.

Relating to the shift register unit S(m), the first clock pulse signal input CLOCK and the second clock pulse signal input CLOCKB of the shift register unit S(m) receive the clock pulse signal CLK or the reverse clock pulse signal CLKB based on m being even or odd. For example, if m is even, referring to FIG. 2, the first clock pulse signal input CLOCK of the shift register unit S(m) is connected to the external circuit to receive the reverse clock pulse signal CLKB, and the second clock pulse signal input CLOCKB of the shift register unit S(m) is connected to the external circuit to receive the clock pulse signal CLK. If m is odd, the first clock pulse signal input CLOCK of the shift register unit S(m) receives the clock pulse signal CLK, and the second clock pulse signal input CLOCKB of the shift register unit S(m) receives the reverse clock pulse signal CLKB.

The low level voltage signal input VGL of the shift register unit S(m) is connected to the external circuit to receive the low level voltage signal VGL. The first starting signal input STVA of the shift register unit S(m) is connected to the reference node N(m−1) of the previous shift register unit S(m−1), and the second starting signal input STVB of the shift register unit S(m) is connected to the external circuit to receive a second starting pulse signal STV2. The reference node N(m) of the shift register unit S(m) is connected to the second starting signal input STVB of the shift register unit S(m−1). The output of the shift register unit S(m) is connected to a corresponding gate line to output an output signal OUT(m) to the gate line.

Figure 3:
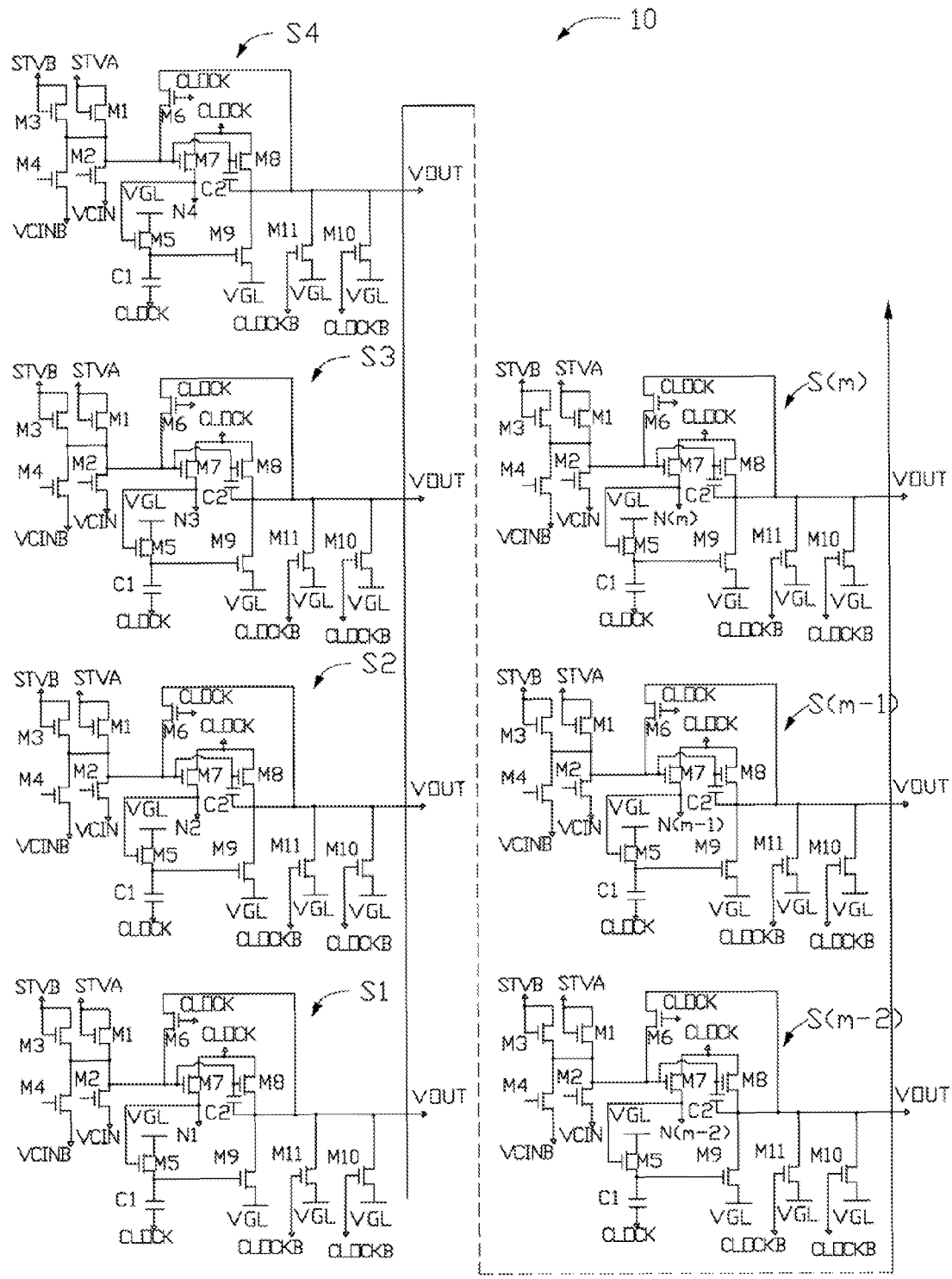
FIG. 3 is a schematic circuit diagram of the shift register of FIG. 2, the shift register including a plurality of shift register units.
Figure 4:
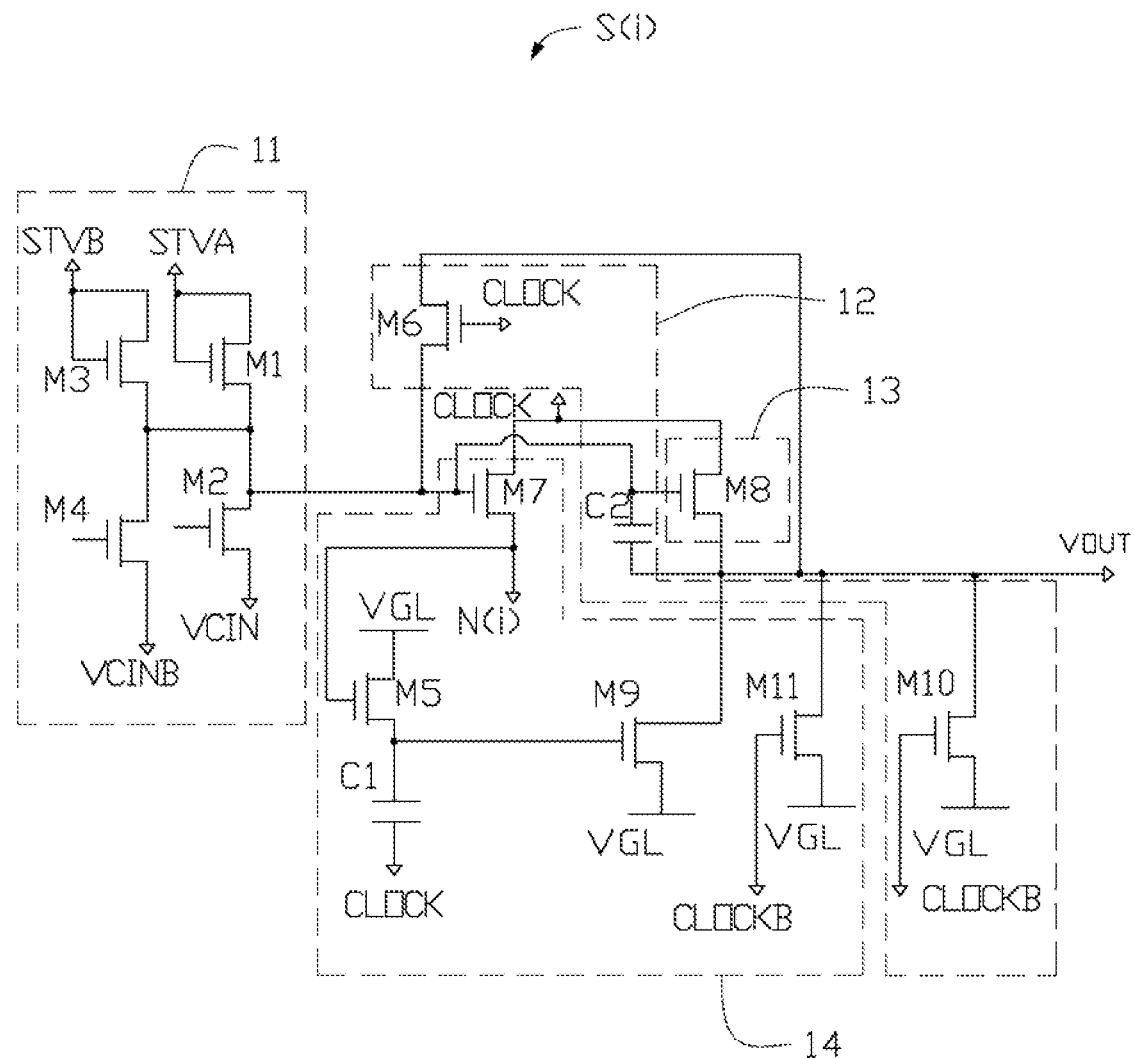
FIG. 4 is a schematic circuit diagram of one shift register unit of the shift register of FIG. 3.

Referring also to FIG. 3 and FIG. 4, FIG. 3 is a schematic circuit diagram of the shift register 10, and FIG. 4 is a schematic circuit diagram of one shift register unit S(i) of the shift register 10. The shift register units of the shift register 10 have the same circuit configuration. Each shift register unit S(i) includes a switching unit 11, a pre-charging unit 12, a pulse signal output unit 13, and a low level voltage signal control unit 14. For better describing, define that the first clock pulse signal input CLOCK of the shift register unit S(i) receives a first clock signal and the second clock pulse signal input CLOCKB of the shift register unit S(i) receives a second clock signal, when i is odd, the first clock signal is the same as the clock pulse signal CLK and the second clock signal is the same as the reverse clock pulse signal CLKB, and when i is even, the first clock signal is the same as the reverse clock pulse signal CLKB and the second clock signal is the same as the clock pulse signal CLK.

The switching unit 11 includes a first transistor M1, a second transistor M2, a third transistor M3, and a fourth transistor M4. A gate electrode and a source electrode of the first transistor M1 are connected to the first starting signal input STVA, and a drain electrode of the first transistor M1 is connected to a source electrode of the second transistor M2. A drain electrode of the second transistor M2 is connected to the first input VCIN. A gate electrode and a source electrode of the third transistor M3 are connected to the second starting signal input STVB, and a drain electrode of the third transistor M3 is connected to a source electrode of the fourth transistor M4. A drain electrode of the fourth transistor M4 is connected to the second input VCINB. The drain electrodes of the first and third transistors M1, M3 are connected. A charging level node (not labeled) is defined at a connection of the drain electrodes of the first and third transistors M1, M3 and the source electrodes of the second and fourth transistors M2, M4.

When i exceeds 1 and is less than m, a gate of the second transistor M2 of the shift register unit S(i) is connected to the second starting signal input STVB of the following shift register unit S(i+1), and a gate of the fourth transistor M4 of the shift register unit S(i) is connected to the output VOUT of the previous shift register unit S(i−1). When i equals 1, the gate of the fourth transistor M4 of the shift register unit S1 is connected to the first starting signal input STVA thereof. When i equals m, the gate of the second transistor M2 of the shift register unit S (m) is connected to the second starting signal input STVB thereof.

When the second signal VC2 received by the second input VCINB is high level, such as 5V voltage, and the gate electrode of the fourth transistor M4 receives a high level signal, such as 5V voltage, the fourth transistor M4 is turned on, and then the second input VCINB provides a high level signal to the charging level node. Thus, the charging level node can output the high level signal from the second input VCINB to the pre-charging unit 12.

When the first signal VC1 received by the first input VCIN is high level and the gate electrode of the second transistor M2 receives a high level signal, the second transistor M2 is turned on, and the first input VCIN provides a high level signal to the charging level node. Thus, the charging level node can output the high level signal from the first input VCIN to the pre-charging unit 12.

The pre-charging unit 12 includes a first capacitor C2, a fifth transistor M6, and a sixth transistor M10. One terminal of the first capacitor C2 is connected to the charging level node and a drain electrode of the fifth transistor M6, and the other terminal of the first capacitor C2 is connected to the output VOUT, a source electrode of the fifth transistor M6, and a source electrode of the sixth transistor M10. A gate of the fifth transistor M6 is connected to the first clock pulse signal input CLOCK. A gate of the sixth transistor M10 is connected to the second clock pulse signal input CLOCKB, and a drain electrode of the sixth transistor M10 is connected to the low level voltage signal input VGL.

When the first clock signal received by the first clock pulse signal input CLOCK is low level and the second clock signal received by the second clock pulse signal input CLOCKB is high level, for example, low level maybe 0V voltage, and high level maybe 5V voltage, the fifth transistor M6 is turned off and the sixth transistor M10 is turned on, and the first capacitor C2 charges.

When the first clock signal received by the first clock pulse signal input CLOCK is high level and the second clock signal received by the second clock pulse signal input CLOCKB is low level, the fifth transistor M6 is turned on and the sixth transistor M10 is turned off, and the first capacitor C2 discharges.

The pulse signal output unit 13 includes a seventh transistor M8. A source electrode of the seventh transistor M8 is connected to the first clock pulse signal input CLOCK, a drain electrode of the seventh transistor M8 is connected to the output VOUT, and a gate electrode of the seventh transistor M8 is connected to the pre-charging unit 12. After the pre-charging unit 12 pre-charges, a voltage level on the gate of the seventh transistor M8 is pulled on at high level to turn on the seventh transistor M8, and then the first clock signal received by the first clock pulse signal input CLOCK is output to the output VOUT via the seventh transistor M8.

The low level voltage signal control unit 14 includes an eighth transistor M5, a ninth transistor M7, a tenth transistor M9, an eleventh transistor M11, and a second capacitor C1. The reference node N(i) is defined at a drain electrode of the ninth transistor M7. The output VOUT is connected to the low level voltage signal input VGL via a source electrode and a drain electrode of the eleventh transistor M11. A gate of the eleventh transistor M11 is connected to the second clock pulse signal input CLOCKB. After the pre-charging unit 12 finishes discharging and when the second clock signal is high level, the eleventh transistor M11 is turned on, and a voltage level on the output VOUT is pulled down to low level.

A gate electrode of the ninth transistor M7 is connected to the pre-charging unit 12, and before the pre-charging unit 12 finishes discharging, the ninth transistor M7 is turned on. A gate electrode of the eighth transistor M5 is connected to the first clock pulse signal input CLOCK via the drain electrode and a source electrode of the ninth transistor M7, and before the pre-charging unit 12 finishes discharging, the eighth transistor M5 is turned on. A gate electrode of the tenth transistor M9 is connected to the low level voltage signal input VGL via a drain electrode and a source electrode of the eighth transistor M5, and a voltage level on the gate of the tenth transistor M9 is pulled down to low level before the pre-charging unit 12 finishes discharging to turn off the tenth transistor M9.

After the pre-charging unit 12 finishes discharging, the ninth transistor M7 is turned off, and the eighth transistor M5 is accordingly turned off. The gate electrode of the tenth transistor M9 is connected to the first clock pulse signal input CLOCK via the second capacitor C1, and the output VOUT is connected to the low level voltage signal input VGL via a source electrode and a drain electrode of the tenth transistor M9. After the pre-charging unit 12 finishes discharging and the first clock signal is high level, the voltage level on the gate of the tenth transistor M9 is pulled on at high level to turn on the tenth transistor M9, and the voltage level of the output VOUT is pulled down to low level.

The transistors M1-M11 may be N-channel thin film transistors, for instance, N-channel metal-oxide-semiconductor (NMOS) transistors.

Figure 5:
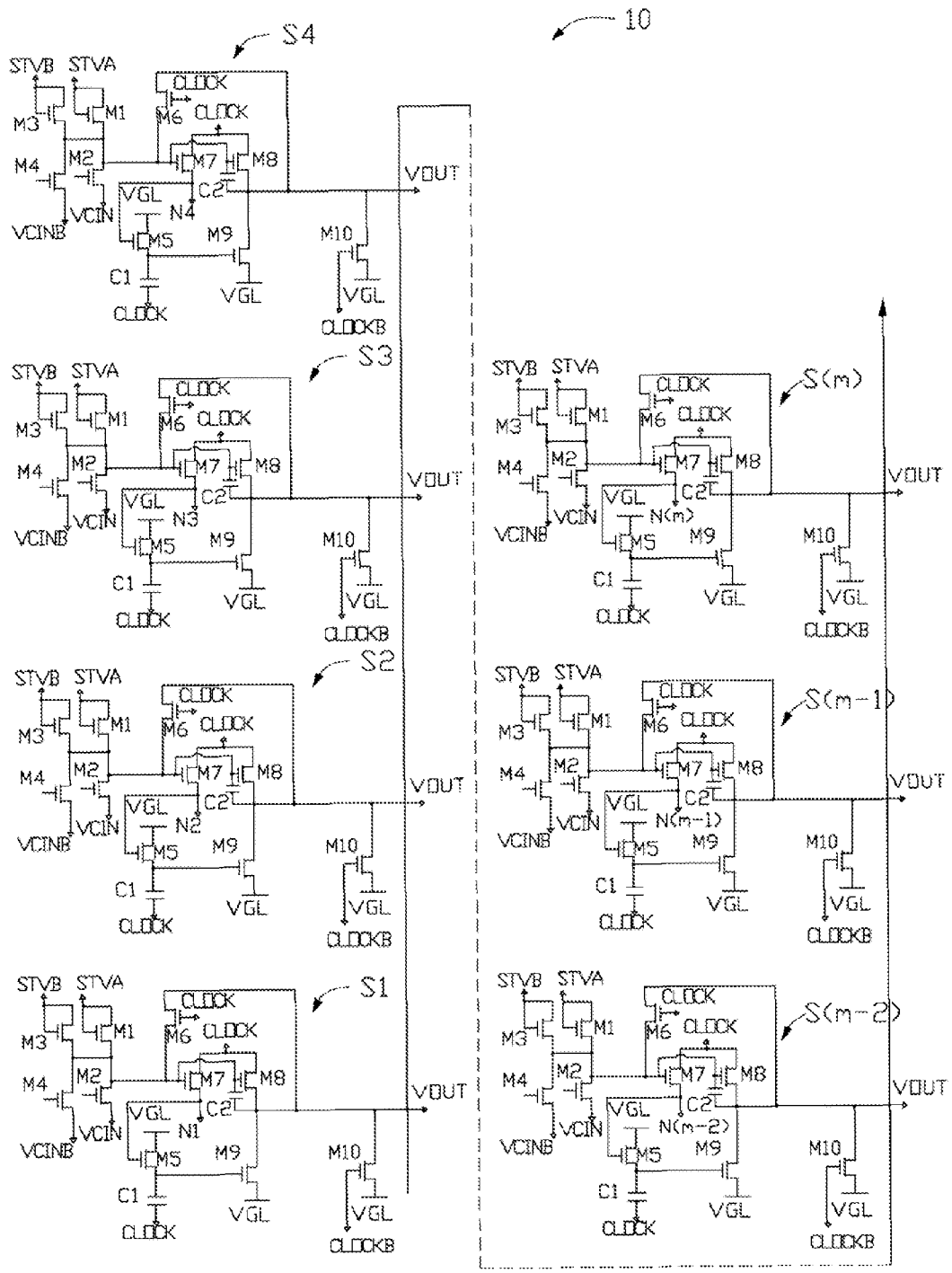
FIG. 5 is a schematic circuit diagram of a shift register according to an alternative embodiment.

For simplifying the circuit configuration of the shift register 10, each shift register unit S(i) can omit the eleventh transistor M11. Because a relationship with other elements and a location in the circuit configuration of the eleventh transistor M11 are the same as the sixth transistor M10, the sixth transistor M10 can achieve a function of the eleventh transistor M11. FIG. 5 shows a circuit configuration of the shift register 10 omitting the eleventh transistors M1.

Figure 6:
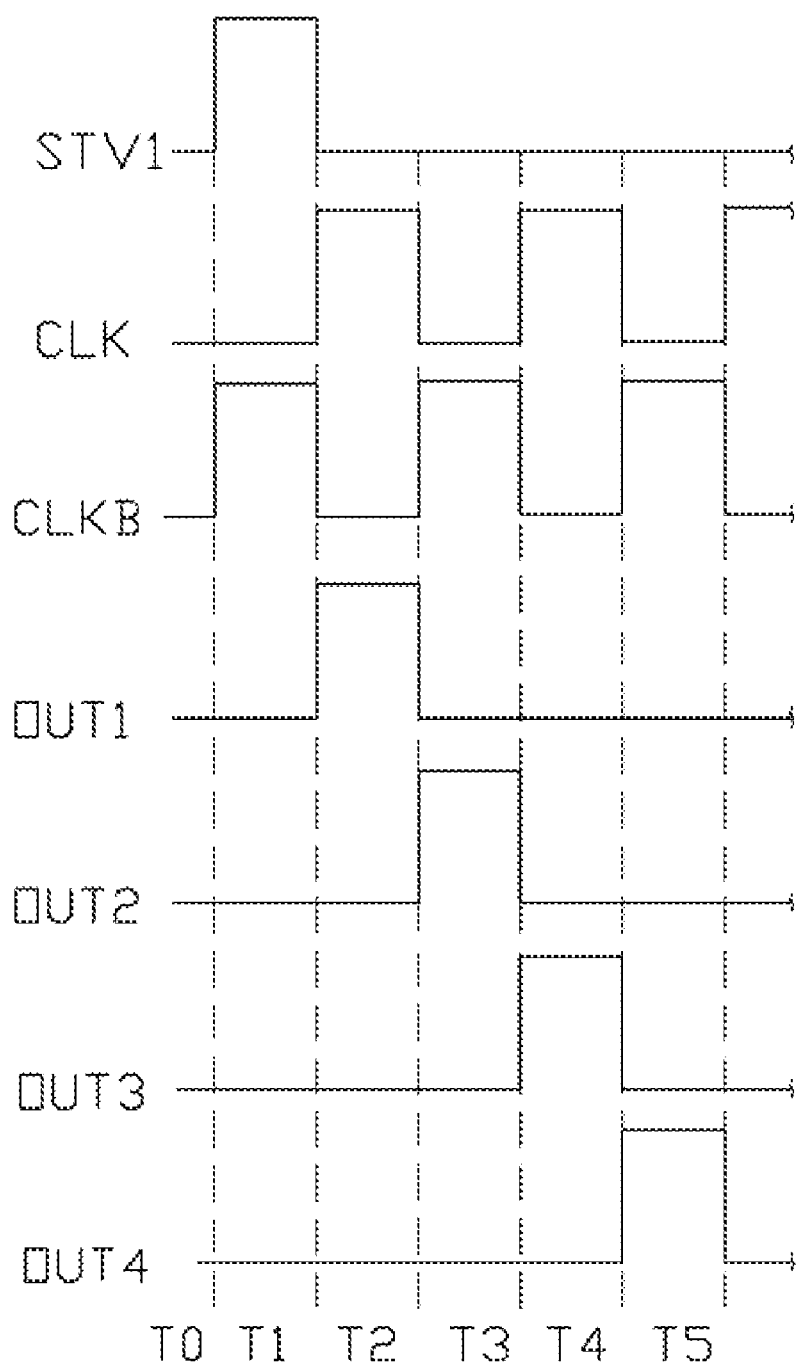
FIG. 6 is a schematic sequence waveform diagram of pulse signals of the shift register of FIG. 2 according to a forward transmission path.

Referring also to FIG. 6, a schematic sequence waveform diagram of pulse signals of the shift register 10 according to a forward transmission path, that is, the shift register 10 successively outputs a high level signal from the shift register unit S1 to the shift register unit S(m). In this operating mode, the second starting pulse signal STV2 and the first signal VC1 keep low level, and the second signal VC2 keeps high level. In this embodiment, high level can be 5V voltage, and low level can be 0V voltage.

During the time of T0, the shift register 10 is at an initial state, and the first starting pulse signal STV1, the clock pulse signal CLK, and the reverse clock pulse signal CLKB are low level. The output signals OUT1-OUT(m) respectively output from the outputs VOUT of the shift register units S1-S(m) are low level.

During the time of T1, the first starting pulse signal STV1 is high level, the clock pulse signal CLK is low level, and the reverse clock pulse signal CLKB is high level. The output signals OUT1-OUT(m) respectively output from the outputs VOUT of the shift register units S1-S(m) are low level.

Relating to the shift register unit S1, because the reverse clock pulse signal CLKB is high level, the sixth transistor M10 of the shift register unit S1 is turned on, and the output VOUT of the shift register unit S1 is connected to the low level voltage signal input VGL via the sixth transistor M10 to receive the low level voltage signal VGL. Thus, the output signal OUT1 output from the output VOUT of the shift register unit S1 is low level during the time of T1. In addition, because the first starting pulse signal STV1 is high level, the first and the fourth transistors M1, M4 are turned on. The charging level node of the shift register unit S1 receives the second signal VC2 via the fourth transistor M4 to charge the first capacitor C2 of the shift register unit S1. When the first capacitor C2 charges, the ninth transistor M7 is turned on, and the reference node N1 receives the clock pulse signal CLK which is low level via the ninth transistor M7. Thus, a voltage level on the reference node N1 is pulled down to low level.

Relating to the shift register unit S(p), wherein p is odd, and is exceeds 1 and less than m, also because the reverse clock pulse signal CLKB is high level, the sixth transistor M10 of the shift register unit S(p) is turned on, and the output VOUT of the shift register unit S(p) is connected to the low level voltage signal input VGL via the sixth transistor M10 to receive the low level voltage signal VGL. Thus, the output signal OUT(p) output from the output VOUT of the shift register unit S(p) is low level during the time of T1. In addition, because the outputs VOUT of the previous shift register unit S(p−1) and the following shift register unit S(p+1) are both low level and the reference nodes N(p−1), N(p+1) also keep low level, the transistors M1-M4 of the shift register unit S(p) are turned off. Thus, the first capacitor C2 of the shift register unit S(p) does not yet charge, and the reference node N(p) keeps low level.

Relating to the shift register unit S(n), wherein n is even, and is exceeds 1 and less than m, because the outputs VOUT of the previous shift register unit S(n−1) and the following shift register unit S(n+1) are both low level and the reference nodes N(n−1), N(n+1) also keep low level, the transistors M1-M4 of the shift register unit S(n) are turned off. Thus, the first capacitor C2 of the shift register unit S(n) does not yet charge, the reference node N(n) keeps low level, and the output VOUT of the shift register unit S(n) keeps low level during the time of T1.

Relating to the shift register unit S(m), whatever m is odd or even, similar to the shift register unit S(p) or S(n), the output VOUT of the shift register unit S(m) outputs low level during the time of T1.

During the time of T2, the first starting pulse signal STV1 is low level, the clock pulse signal CLK is high level, and the reverse clock pulse signal CLKB is low level. The output signal OUT1 output from the output VOUT of the shift register unit S1 is high level, and the other shift register units S2-S(m) keep low level.

Relating to the shift register unit S1, because the reverse clock pulse signal CLKB is low level, the sixth transistor M10 of the shift register unit S1 is turned off. Because the first capacitor C2 of shift register unit S1 finishes charging, the ninth and the seventh transistors M7, M8 keeps being turned on. Thus, the output VOUT of the shift register unit S1 receives the clock pulse signal CLK which is high level via the seventh transistor M8, and outputs high level during the time of T2. In addition, the reference node N1 receives the clock pulse signal CLK via the ninth transistor M7, and the voltage level on the reference node N1 is pulled on at high level. The eighth transistor M5 is accordingly turned on, and the gate of the tenth transistor M9 is connected to the low level voltage signal input VGL via the eighth transistor M5 to turn off the tenth transistor M9. Because the clock pulse signal CLK is high level, the fifth transistor M6 is turned on, and the first capacitor C2 starts to discharge via the fifth transistor M6.

Relating to the shift register unit S2, because the clock pulse signal CLK is high level, the sixth transistor M10 of the shift register unit S2 is turned on, and the output VOUT of the shift register unit S2 is connected to the low level voltage signal input VGL via the sixth transistor M10 to receive the low level voltage signal VGL. Thus, the output VOUT of the shift register unit S2 keeps low level during the time of T2. In addition, because the output VOUT of the shift register unit S1 outputs high level, the fourth transistor M4 of the shift register unit S2 is turned on, and the charging level node of the shift register unit S2 receives the second signal VC2 which is high level via the fourth transistor M4 to charge the first capacitor C2. When the first capacitor C2 charges, the ninth transistor M7 is turned on, and the reference node N2 receives the reverse clock pulse signal CLKB which is low level via the ninth transistor M7. Thus, the voltage level on the reference node N2 is pulled down to low level.

Relating to the shift register unit S(n), wherein n is even, and is exceeds 1 and less than m, when n is exceeds 2, because the clock pulse signal CLK is high level, the sixth transistor M10 of the shift register unit S(n) is turned on, and the output VOUT of the shift register unit S(n) is connected to the low level voltage signal input VGL via the sixth transistor M10 to receive the low level voltage signal VGL. Thus, the output VOUT of the shift register unit S(n) keeps low level during the time of T2. In addition, the first capacitor C2 of the shift register unit S(n+2) does not yet charge, and the reference node N(n) keeps low level.

Relating to the shift register unit S(p), wherein p is odd, and is exceeds 1 and less than m, because the outputs VOUT of the previous shift register unit S(p−1) and the following shift register unit S(p+1) are both low level and the reference nodes N(p−1), N(p+1) also keep low level, the transistors M1-M4 of the shift register unit S(p) are turned off. Thus, the first capacitor C2 of the shift register unit S(p) does not charge, and the output VOUT of the shift register unit S(p) keeps low level during the time of T2.

Relating to the shift register unit S(m), similar to the shift register unit S(p) or S(n), the output VOUT of the shift register unit S(m) outputs low level during the time of T2.

During the time of T3, the first starting pulse signal STV1 keeps low level, the clock pulse signal CLK is low level, and the reverse clock pulse signal CLKB is high level. The output signal OUT2 output from the output VOUT of the shift register unit S2 is high level, and the other shift register units S1, S3-S(m) output low level.

Relating to the shift register unit S1, because the reverse clock pulse signal CLKB is high level, the sixth transistor M10 of the shift register unit S1 is turned on, and the output VOUT of the shift register unit S1 is connected to the low level voltage signal input VGL via the sixth transistor M10 to receive the low level voltage signal VGL. Thus, the output signal OUT1 output from the output VOUT of the shift register unit S1 is low level during the time of T3. In addition, because the clock pulse signal CLK is low level, and the first capacitor C2 of the shift register unit S1 discharges during the time of T2, the fifth, the ninth and the seventh transistors M6, M7, M8 are turned off. Because the clock pulse signal CLK is low level, the tenth transistor M9 is still turned off.

Relating to the shift register unit S2, because the clock pulse signal CLK is low level, the sixth transistor M10 of the shift register unit S2 is turned off. Because the first capacitor C2 of shift register unit S2 finishes charging, the ninth and the seventh transistors M7, M8 keeps being turned on. Thus, the output VOUT of the shift register unit S2 receives the reverse clock pulse signal CLKB which is high level via the seventh transistor M8, and outputs high level during the time of T3. In addition, the reference node N2 receives the reverse clock pulse signal CLKB via the ninth transistor M7, and the voltage level on the reference node N2 is pulled on at high level. The eighth transistor M5 is accordingly turned on, and the gate of the tenth transistor M9 is connected to the low level voltage signal input VGL via the eighth transistor M5 to turn off the tenth transistor M9. Because the reverse clock pulse signal CLKB is high level, the fifth transistor M6 is turned on, and the first capacitor C2 of the shift register unit S2 starts to discharge via the fifth transistor M6.

Relating to the shift register unit S3, because the reverse clock pulse signal CLKB is high level, the sixth transistor M10 of the shift register unit S3 is turned on, and the output VOUT of the shift register unit S3 is connected to the low level voltage signal input VGL via the sixth transistor M10 to receive the low level voltage signal VGL. Thus, the output VOUT of the shift register unit S3 outputs low level during the time of T3. In addition, because the output VOUT of the shift register unit S2 outputs high level, the fourth transistor M4 is turned on. Thus, the charging level node of the shift register unit S3 receives the second signal VC2 which is high level via the fourth transistor M4 to charge the first capacitor C2 of the shift register unit S3. When the first capacitor C2 charges, the ninth transistor M7 is turned on, and the reference node N3 of the shift register unit S3 receives the clock pulse signal CLK which is low level via the ninth transistor M7. Thus, the voltage level on the reference node N3 is pulled down to low level.

Relating to the shift register unit S(n), wherein n is even, and is exceeds 1 and less than m, when n is exceeds 2, because the outputs VOUT of the previous shift register unit S(n−1) and the following shift register unit S(n+1) are both low level and the reference nodes N(n−1), N(n+1) also keep low level, the transistors M1-M4 are turned off. Thus, the first capacitor C2 of the shift register unit S(n) does not yet charge, and the output VOUT of the shift register unit S(n) keeps low level during the time of T3.

Relating to the shift register unit S(p), wherein p is odd, and is exceeds 1 and less than m, when p is exceeds 3, because the reverse clock pulse signal CLKB is high level, the sixth transistor M10 of the shift register unit S(p) is turned on, and the output VOUT of the shift register unit S(p) is connected to the low level voltage signal input VGL via the sixth transistor M10 to receive the low level voltage signal VGL. Thus, the output VOUT of the shift register unit S(p) outputs low level during the time of T3. In addition, the first capacitor C2 of the shift register unit S(p) does not yet charge, and the reference node N(p) keeps low level.

Relating to the shift register unit S(m), similar to the shift register unit S(p) or S(n), the output VOUT of the shift register unit S(m) outputs low level during the time of T3.

During the time of T4, the first starting pulse signal STV1 keeps low level, the clock pulse signal CLK is high level, and the reverse clock pulse signal CLKB is low level. The output signal OUT3 output from the output VOUT of the shift register unit S3 is high level, and the other shift register units S1-S2, S4-S(m) output low level.

Relating to the shift register unit S1, because the first starting pulse signal STV1 keeps low level, the first capacitor C2 of the shift register unit S1 does not charge, and the ninth and the seventh transistors M7, M8 keeps being turned off. Thus, the eighth transistor M5 is still turned off, and the tenth transistor M9 receives the clock pulse signal CLK which is high level to be turned on. The output VOUT of the shift register unit S1 receives the low level voltage signal VGL via the tenth transistor M9, and keeps low level during the time of T4.

Relating to the shift register unit S2, because the clock pulse signal CLK is high level, the sixth transistor M10 of the shift register unit S2 is turned on, and the output VOUT of the shift register unit S2 is connected to the low level voltage signal input VGL via the sixth transistor M10 to receive the low level voltage signal VGL. Thus, the output VOUT of the shift register unit S2 outputs low level during the time of T4.

In addition, the first capacitor C2 of the shift register unit S2 does not charges, and the voltage level on the reference node N2 is low level.

Relating to the shift register unit S3, because the reverse clock pulse signal CLKB is low level, the sixth transistor M10 of the shift register unit S3 is turned off. Because the first capacitor C2 of the shift register unit S3 finishes charging during the time of T3, the ninth and the seventh transistors M7, M8 are turned on. Thus, the reference node N3 receives the clock pulse signal CLK which is high level via the ninth transistor M7, and the voltage level on the reference node N3 is pulled on at high level. The output VOUT of the shift register unit S3 receives the clock pulse signal CLK via the seventh transistor M8 and outputs high level during the time of T4. In addition, because the voltage level on the reference node N3 is high level, the eighth transistor M5 is turned on, and the tenth transistor M9 is turned off. Because the clock pulse signal CLK is high level, the fifth transistor M6 is turned on, and the first capacitor C2 of the shift register unit S3 starts to discharge via the fifth transistor M6.

Relating to the shift register unit S4, because the clock pulse signal CLK is high level, the sixth transistor M10 of the shift register unit S4 is turned on, and the output VOUT of the shift register unit S4 is connected to the low level voltage signal input VGL via the sixth transistor M10 to receive the low level voltage signal VGL. Thus, the output signal OUT4 output from the output VOUT of the shift register unit S4 is low level during the time of T4. In addition, because the output VOUT of the shift register unit S3 outputs high level, the fourth transistor M4 of the shift register unit S4 is turned on, and the charging level node of the shift register unit S4 receives the second signal VC2 which is high level via the fourth transistor M4 to charge the first capacitor C2. When the first capacitor C2 charges, the ninth transistor M7 is turned on, and the reference node N4 receives the reverse clock pulse signal CLKB which is low level via the ninth transistor M7. Thus, the voltage level on the reference node N4 is pulled down to low level.

Relating to the shift register unit S(n), wherein n is even, and is exceeds 1 and less than m, when n is exceeds 4, because the clock pulse signal CLK is high level, the sixth transistor M10 of the shift register unit S(n) is turned on, and the output VOUT of the shift register unit S(n) is connected to the low level voltage signal input VGL via the sixth transistor M10 to receive the low level voltage signal VGL. Thus, the output VOUT of the shift register unit S(n) outputs low level during the time of T4. In addition, the first capacitor C2 of the shift register unit S(n) does not yet charge, and the reference node N(n) keeps low level.

Relating to the shift register unit S(p), wherein p is odd, and is exceeds 1 and less than m, when p is exceeds 3, because the outputs VOUT of the previous shift register unit S(p−1) and the following shift register unit S(p+1) are both low level and the reference nodes N(p−1), N(p+1) also keep low level, the transistors M1-M4 are turned off. Thus, the first capacitor C2 of the shift register unit S(p) does not yet charge, and the output VOUT of the shift register unit S(p) keeps low level during the time of T4.

Relating to the shift register unit S(m), similar to the shift register unit S(p) or S(n), the output VOUT of the shift register unit S(m) outputs low level during the time of T4.

Accordingly, respectively during the time of T5-T(m+1), the shift register units S4-S(m) successively output high level.

Figure 7:
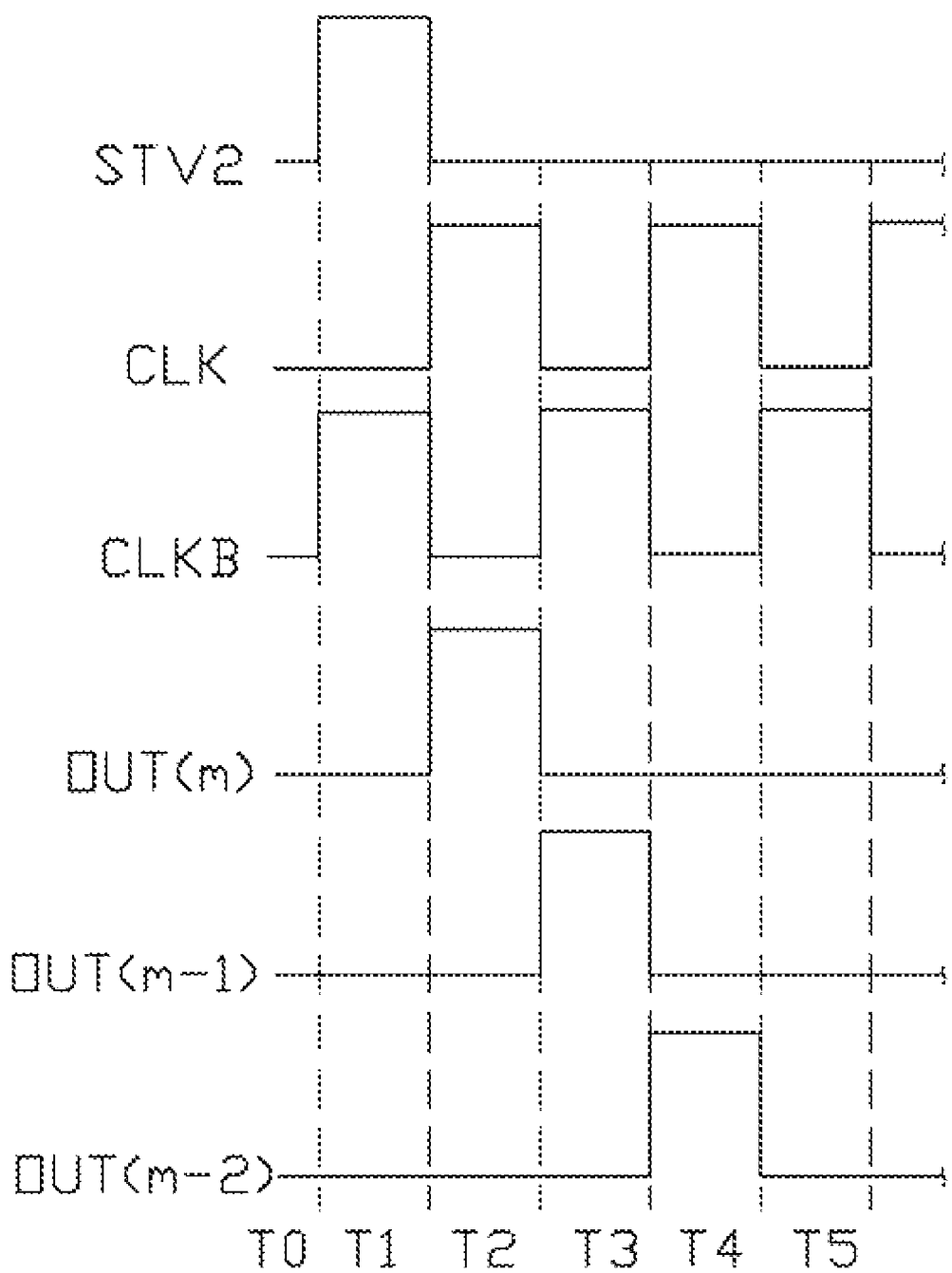
FIG. 7 is a schematic sequence waveform diagram of pulse signals of the shift register of FIG. 2 according to a reverse transmission path.

Referring also to FIG. 7, FIG. 7 shows a schematic sequence waveform diagram of pulse signals of the shift register 10 according to a reverse transmission path, that is, the shift register 10 successively outputs a high level from the shift register unit S(m) to the shift register unit S1. In this operating mode, the first starting pulse signal STV1 and the second signal VC2 keep low level, and the first signal VC1 keeps high level.

Similar to the operation of the shift register 10 detailed above, respectively during the time of T1-T(m+1), the shift register units S(m)-S1 successively output high level.

In alternative embodiment, the shift register units 51, S(m) of the shift register 10 can be dummy outputs, and the shift register units S2-S(m−1) can be active outputs to output the gate signals to the gate driving circuit 23.

The shift register 10 can output the output signals along not only the forward transmission path successively from the shift register unit S1 to the shift register unit S(m) but also the reverse transmission path from the shift register unit S(m) to the shift register unit S(1). Thus, the gate driving circuit 23 using the shift register 10 provides flexibility and can be applied with a variety of different display panels.

It is believed that the present embodiments and their advantages will be understood from the foregoing description, and it will be apparent that various changes may be made thereto without departing from the spirit and scope of the embodiments or sacrificing all of their material advantages.

What is claimed is:

1. A shift register, comprising:
a plurality of individually connected shift register units, each shift register unit comprising a switching unit, a pre-charging unit, a pulse signal output unit, a low level voltage signal control unit, a first clock pulse signal input, a second clock pulse signal input, a first starting signal input, a second starting signal input, a reference node, and an output;
wherein the first and the second clock pulse signal inputs respectively receive a first clock signal and a second clock signal, the first clock signal and the second clock signal having reverse clock pulses during each clock cycle; the switching unit receives at least one external starting signal and a high level signal, when the at least one external starting signal is high level, the switching unit is turned on and outputs the high level signal to the pre-charging unit; when the second clock signal is high level, the pre-charging unit receives the high level signal output by the switching unit and charges, when the first clock signal is high level, the pre-charging unit discharges; the pulse signal output unit receives the first clock signal via the first clock pulse signal input, and outputs the first clock signal to the output after the pre-charging unit charges and before the pre-charging unit finishes discharging; and the low level voltage signal control unit receives the first clock signal and the second clock signal, after the pre-charging unit finishes discharging, the low level voltage signal control unit pulls down a voltage level on the output at low level when the second clock signal are high level;
wherein the first starting signal input of one of the shift register units is connected to an external circuit to receive a first starting pulse signal, the second starting signal input of the shift register unit is connected to a reference node of the following shift register unit, and the reference node of the shift register unit is connected to the first starting signal input of the following shift register unit.

2. The shift register of claim 1, wherein the switching unit comprises a first transistor, a second transistor, a third transistor, and a fourth transistor, one of gate electrodes of the second and the fourth transistors to receive the at least one external starting signal, one of drain electrodes of the second and the fourth transistors accordingly to receive the high level signal, and a charging level node defined at a connection of drain electrodes of the first and third transistors and source electrodes of the second and fourth transistors to output the high level signal to the pre-charging unit.

3. The shift register of claim 2, wherein the pre-charging unit comprises a first capacitor, a fifth transistor, and a sixth transistor, one terminal of the first capacitor connected to the charging level node and a drain electrode of the fifth transistor, the other terminal of the first capacitor connected to a source electrode of the fifth transistor and a low level voltage signal input via a source electrode and a drain electrode of the sixth transistor, a gate of the fifth transistor connected to the first clock pulse signal input, and a gate of the sixth transistor connected to the second clock pulse signal input.

4. The shift register of claim 3, wherein when the first clock signal is low level and the second clock signal is high level, the fifth transistor is turned off, and the sixth transistor is turned on, and when the charging level node outputs the high level signal, the first capacitor charges.

5. The shift register of claim 3, wherein when the first clock signal is high level and the second clock signal is low level, the fifth transistor is turned on, and the first capacitor discharges.

6. The shift register of claim 3, wherein the output is connected to the low level voltage signal input via the source electrode and the drain electrode of the sixth transistor, after the pre-charging unit finishes discharging and when the second clock signal is high level, the sixth transistor turned on and pulling down the voltage level of the output at low level.

7. The shift register of claim 6, wherein the pulse signal output unit comprises a seventh transistor, a source electrode of the seventh transistor connected to the first clock pulse signal input, a drain electrode of the seventh transistor connected to the output, and a gate electrode of the seventh eighth transistor connected to the pre-charging unit, after the pre-charging unit pre-charges, a voltage level on the gate of the seventh transistor being pulled on at high level to turn on the seventh transistor, and the first clock signal is output to the output via the seventh transistor.

8. The shift register of claim 7, wherein the low level voltage signal control unit comprises an eighth transistor, a ninth transistor, a tenth transistor, and a second capacitor, a gate electrode of the ninth transistor connected to the pre-charging unit and turned on before the pre-charging unit finishes discharging, a gate electrode of the eighth transistor connected to the first clock pulse signal input via a drain electrode and a source electrode of the ninth transistor and turned on before the pre-charging unit finishes discharging, a gate electrode of the tenth transistor connected to the low level voltage signal input via a drain electrode and a source electrode of the eighth transistor, a voltage level on the gate of the tenth transistor being pulled down to low level before the pre-charging unit finishes discharging to turn off the tenth transistor, the gate of the tenth transistor connected to the first clock pulse signal input via the second capacitor, when the ninth transistor is turned off after the pre-charging unit finishes discharging to turn off the eighth transistor and the first clock signal is high level, the tenth transistor turned on and pulling down the voltage level of the output at low level.

9. The shift register of claim 1, wherein the low level voltage signal control unit comprises an eleventh transistor, the output connected to a low level voltage signal input via a source electrode and a drain electrode of the eleventh transistor, a gate of the eleventh transistor connected to the second clock pulse signal input, and after the pre-charging unit finishes discharging and when the second clock signal is high level, the eleventh transistor turned on and pulling down the voltage level of the output at low level.

10. The shift register of claim 8, wherein each shift register unit further comprises a first input and a second input, a gate electrode and a source electrode of the first transistor connected to the first starting signal input, a drain electrode of the second transistor connected to the first input, a gate electrode and a source electrode of the third transistor connected to the second starting signal input, and a drain electrode of the fourth transistor connected to the second input.

11. The shift register of claim 10, wherein the reference node is defined at the drain electrode of the ninth transistor, and a number of the plurality of shift register units is m, wherein m is an integer and exceeds 1, for the first shift register unit of the plurality of shift register units, the gate of the fourth transistor of the first shift register unit is connected to the first starting signal input thereof, the gate electrode of the second transistor of the first shift register unit is connected to the output of the second shift register unit, the reference node of the first shift register unit is connected to the first starting signal input of the second shift register unit, and the second starting signal input of the first shift register unit is connected to the reference node of the second shift register unit; for the mth shift register unit of the plurality of shift register units, the gate of the fourth transistor of the mth shift register unit is connected to the output of the (m−1)th shift register unit, the gate electrode of the second transistor of the mth shift register unit is connected to the second starting signal input thereof, the reference node of the mth register unit is connected to the second starting signal input of the (m−1)th shift register unit, and the first starting signal input of the mth shift register unit is connected to the output of the (m−1)th shift register unit; for the other shift register units of the plurality of shift register units, the gate electrode of the fourth transistor of each shift register unit is connected to the output of the previous shift register unit, the gate electrode of the second transistor of each shift register unit is connected to the output of the following shift register unit, the first starting signal input of each shift register unit is connected to the reference node of the previous shift register unit, and the second starting signal input of each shift register unit is connected to the reference node of the following shift register unit.

12. The shift register of claim 11, wherein for the odd shift register units of the plurality of shift register units, the first clock pulse signal inputs of odd shift register units receive a clock pulse signal and the second clock pulse signal inputs of odd shift register units receive a reverse clock pulse signal; for the even shift register units of the plurality of shift register units, the first clock pulse signal inputs of even shift register units receive the reverse clock pulse signal and the second clock pulse signal inputs of even shift register units receive the clock pulse signal.

13. A liquid crystal display (LCD) device, comprising:
a display panel; and
a gate driving circuit to successively output gate signals to the display panel, comprising:
a shift register comprising:
a plurality of individually connected shift register units to successively output the gate signals, each shift register unit comprising a switching unit, a pre-charging unit, a pulse signal output unit, a low level voltage signal control unit, a first clock pulse signal input, a second clock pulse signal input, a first starting signal input, a second starting signal input, a reference node, and an output;

wherein the first and the second clock pulse signal inputs respectively receive a first clock signal and a second clock signal, the first clock signal and the second clock signal having reverse clock pulses during each clock cycle; the switching unit receives at least one external starting signal and a high level signal, when the at least one external starting signal is high level, the switching unit is turned on and outputs the high level signal to the pre-charging unit; when the second clock signal is high level, the pre-charging unit receives the high level signal output by the switching unit and charges, when the first clock signal is high level, the pre-charging unit discharges; the pulse signal output unit receives the first clock signal via the first clock pulse signal input, and outputs the first clock signal to the output after the pre-charging unit charges and before the pre-charging unit finishes discharging; and the low level voltage signal control unit receives the first clock signal and the second clock signal, after the pre-charging unit finishes discharging, the low level voltage signal control unit pulls down a voltage level on the output at low level when the second clock signal are high level;
wherein the first starting signal input of one of the shift register units is connected to an external circuit to receive a first starting pulse signal, the second starting signal input of the shift register unit is connected to a reference node of the following shift register unit, and the reference node of the shift register unit is connected to the first starting signal input of the following shift register unit.

14. The LCD device of claim 13, wherein each shift register unit further comprises a first input, and a second input, the first input receiving an external first signal, the second input receiving an external second signal, one of the first and the second starting signal inputs keeps low level, and the other of the first and the second starting signal inputs outputs high level when the shift register is on an initial state.

15. The LCD device of claim 14, wherein a number of the plurality of shift register units is m, wherein m is an integer and exceeds 1, for the first shift register unit of the plurality of shift register units, the first starting signal input of the first shift register unit receives a first external staring signal, the second starting signal input of the first shift register unit is connected to the reference node of the second shift register unit, and the reference node of the first shift register unit is connected to the first starting signal input of the second shift register unit; for the mth shift register unit of the plurality of shift register units, the first starting signal input of the mth shift register unit is connected to the reference node of the (m−1)th shift register unit, the second starting signal input of the mth shift register unit receives a second external starting signal, and the reference node of the mth shift register unit is connected to the second starting signal input of the (m−1)th shift register unit; for the other shift register units of the plurality of shift register units, the first starting signal input of each shift register unit is connected to the reference node of the previous shift register unit, the second starting signal input of each shift register unit is connected to the reference node of the following shift register unit, and the reference node of each shift register unit is connected to the first starting signal input of the following shift register unit.

16. The LCD device of claim 15, wherein for the odd shift register units of the plurality of shift register units, the first clock pulse signal inputs of odd shift register units receive a clock pulse signal and the second clock pulse signal inputs of odd shift register units receive a reverse clock pulse signal; for the even shift register units of the plurality of shift register units, the first clock pulse signal inputs of even shift register units receive the reverse clock pulse signal and the second clock pulse signal inputs of even shift register units receive the clock pulse signal.

17. The LCD device of claim 16, wherein the switching unit of each shift register unit comprises a first transistor, a second transistor, a third transistor, and a fourth transistor, and a charging level node is defined at a connection of drain electrodes of the first and third transistors and source electrodes of the second and fourth transistors to output the high level signal to the pre-charging unit, a gate electrode and a source electrode of the first transistor connected to the first starting signal input, a gate electrode and a source electrode of the third transistor connected to the second starting signal input, a drain electrode of the second transistor connected to the first input, the drain electrode of the fourth transistor connected to the second input, for the first shift register unit of the plurality of shift register units, a gate of the fourth transistor of the first shift register unit connected to the first starting signal input thereof, a gate electrode of the second transistor of the first shift register unit connected to the output of the second shift register unit, for the mth shift register unit of the plurality of shift register units, a gate of the fourth transistor of the mth shift register unit connected to the output of the (m−1)th shift register unit, a gate electrode of the second transistor of the mth shift register unit connected to the second starting signal input thereof, for the other shift register units of the plurality of shift register units, a gate electrode of the fourth transistor of each shift register unit connected to the output of the previous shift register unit, and a gate electrode of the second transistor of each shift register unit connected to the output of the following shift register unit.

18. The LCD device of claim 17, wherein when the external second signal is high level and the fourth transistor is turned on, the high level signal from the second input is provided to the charging level node to charge the pre-charging unit, and when the external first signal is high level and the second transistor is turned on, the high level signal from the first input is provided to the charging level node to charge the pre-charging unit.

19. The LCD device of claim 18, wherein the pre-charging unit comprises a first capacitor, a fifth transistor, and a sixth transistor, one terminal of the first capacitor connected to the charging level node and a drain electrode of the fifth transistor, the other terminal of the first capacitor connected to a source electrode of the fifth transistor and a low level voltage signal input via a source electrode and a drain electrode of the sixth transistor, a gate of the fifth transistor connected to the first clock pulse signal input, and a gate of the sixth transistor connected to the second clock pulse signal input.

20. The LCD device of claim 19, wherein the output is connected to the low level voltage signal input via the source electrode and the drain electrode of the sixth transistor, after the pre-charging unit finishes discharging and when the second clock signal is high level, the sixth transistor turned on and pulling down the voltage level of the output at low level.

21. The LCD device of claim 20, wherein the pulse signal output unit comprises a seventh transistor, a source electrode of the seventh transistor connected to the first clock pulse signal input, a drain electrode of the seventh transistor connected to the output, and a gate electrode of the seventh transistor connected to the pre-charging unit, after the pre-charging unit pre-charges, a voltage level on the gate of the seventh transistor being pulled on at high level to turn on the seventh transistor, and the first clock signal is output to the output via the seventh transistor.

22. The LCD device of claim 21, wherein the low level voltage signal control unit comprises an eighth transistor, a ninth transistor, a tenth transistor, and a second capacitor, a gate electrode of the ninth transistor connected to the pre-charging unit and turned on before the pre-charging unit finishes discharging, a gate electrode of the eighth transistor connected to the first clock pulse signal input via a drain electrode and a source electrode of the ninth transistor and turned on before the pre-charging unit finishes discharging, a gate electrode of the tenth transistor connected to the low level voltage signal input via a drain electrode and a source electrode of the eighth transistor, a voltage level on the gate of the tenth transistor being pulled down to low level before the pre-charging unit finishes discharging to turn off the tenth transistor, the gate of the tenth transistor connected to the first clock pulse signal input via the second capacitor, when the ninth transistor is turned off after the pre-charging unit finishes discharging to turn off the eighth transistor and the first clock signal is high level, the tenth transistor turned on and pulling down the voltage level of the output at low level.

23. The LCD device of claim 13, wherein the low level voltage signal control unit comprises an eleventh transistor, the output connected to a low level voltage signal input via a source electrode and a drain electrode of the eleventh transistor, a gate of the eleventh transistor connected to the second clock pulse signal input, and after the pre-charging unit finishes discharging and when the second clock signal is high level, the eleventh transistor turned on and pulling down the voltage level of the output at low level.

* * * * *